United States Patent [19]
Kikuda et al.

[11] Patent Number: 5,063,313
[45] Date of Patent: Nov. 5, 1991

[54] DELAY CIRCUIT EMPLOYING DIFFERENT THRESHOLD FET'S

[75] Inventors: Shigeru Kikuda; Hiroshi Miyamoto; Michihiro Yamada, all of Hyogo, Japan

[73] Assignee: Mitsubishi Denki Kabushiki Kaisha, Tokyo, Japan

[21] Appl. No.: 459,238

[22] Filed: Dec. 29, 1989

Related U.S. Application Data

[63] Continuation of Ser. No. 155,541, Feb. 12, 1988.

[30] Foreign Application Priority Data

Feb. 25, 1987 [JP] Japan .................... 62-41837

[51] Int. Cl.[5] ............... H03K 5/13; H03K 17/284; H03K 17/30
[52] U.S. Cl. ..................... 307/605; 307/451; 307/585
[58] Field of Search ............... 307/605, 451, 290, 585; 379/72, 79

[56] References Cited

U.S. PATENT DOCUMENTS

| | | | |
|---|---|---|---|
| 4,571,504 | 2/1986 | Iwamoto et al. | 307/290 |
| 4,603,264 | 7/1986 | Nakano | 307/290 |
| 4,703,201 | 10/1987 | McGrail | 307/290 |
| 4,914,326 | 4/1990 | Kikuda et al. | 307/605 |

FOREIGN PATENT DOCUMENTS 61-293016 6/1985 Japan .

*Primary Examiner*—John S. Heyman
*Attorney, Agent, or Firm*—Lowe, Price, LeBlanc and Becker

[57] ABSTRACT

A delay circuit having a complementary insulated gate device comprises an inverter (10) having a series connection of a p type field effect transistor Q3 and an n type field effect transistor Q4 and a transmission gate (20) having a parallel connection of a p type field effect transistor Q1 and an n type field effect transistor Q2 connected to the preceding stage of the inverter (10), and the gates of the transistors Q1 and Q2 are connected together to an output terminal (3). The logical threshold voltage of the inverter (10) is set at a higher value in the range of the input voltage of the inverter (10). There is a peculiar period in which the transistors Q1 and Q2 of the transmission gate (20) transmit only a litle increase of the input voltage to the inverter (10) during the increase of the input voltage. Due to the existence of this peculiar period, this circuit outputs a delayed output signal only when the input voltage increases. In addition, the rise time and fall time of the output signal are short.

20 Claims, 6 Drawing Sheets

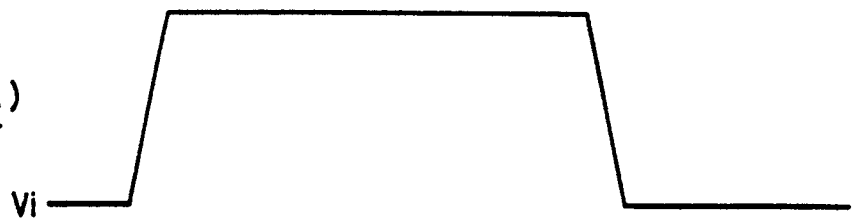
FIG.4(a) PRIOR ART
FIG.4(b) PRIOR ART
FIG.5
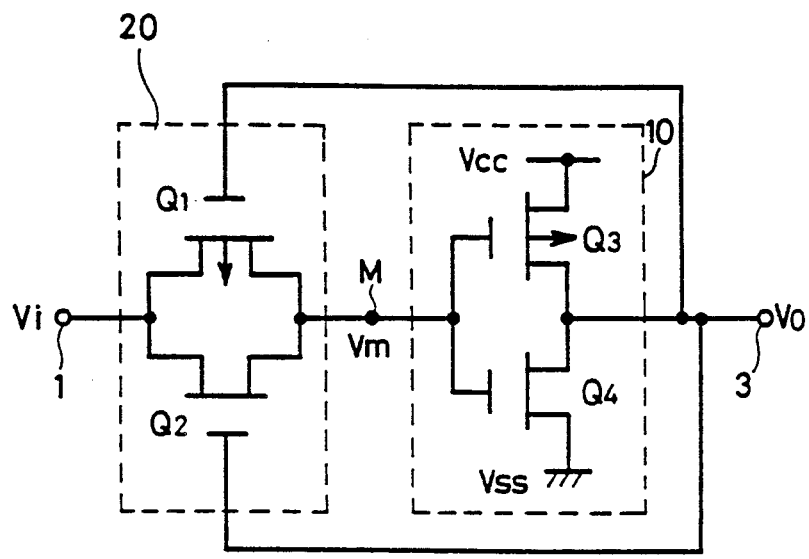

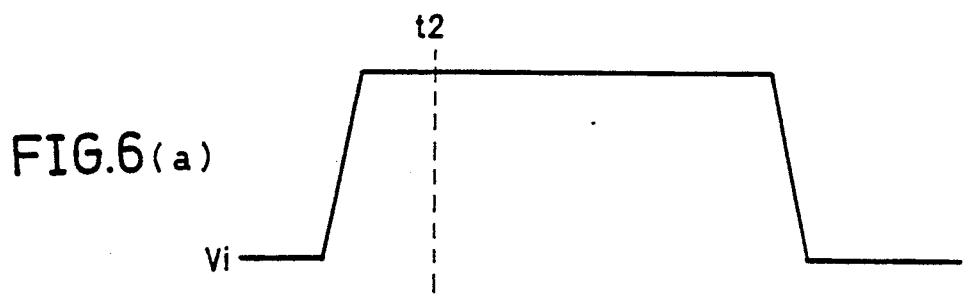
FIG.6(a)
FIG.6(b)
FIG.6(c)
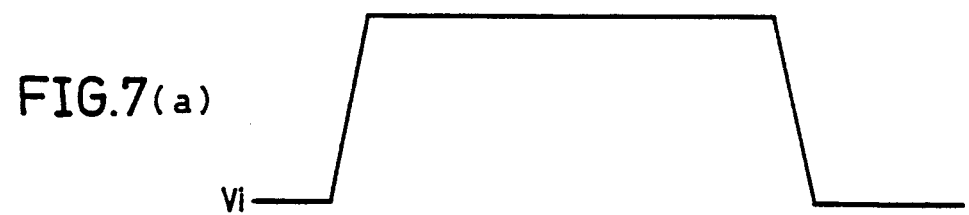
FIG.7(a)
FIG.7(b)
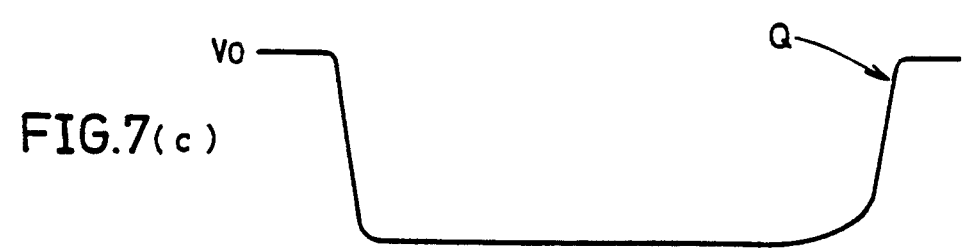
FIG.7(c)

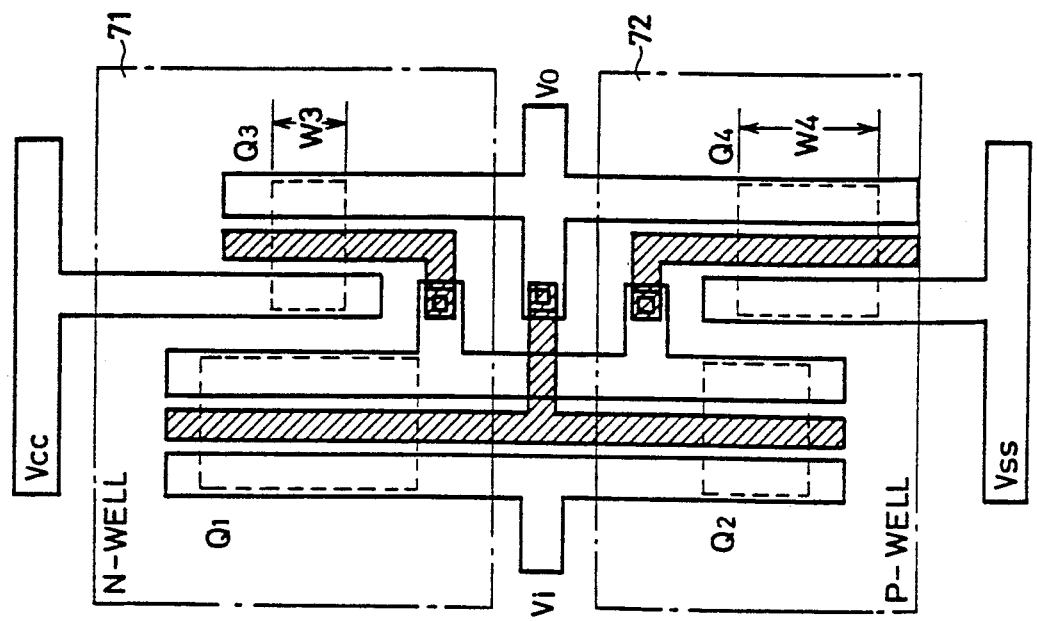
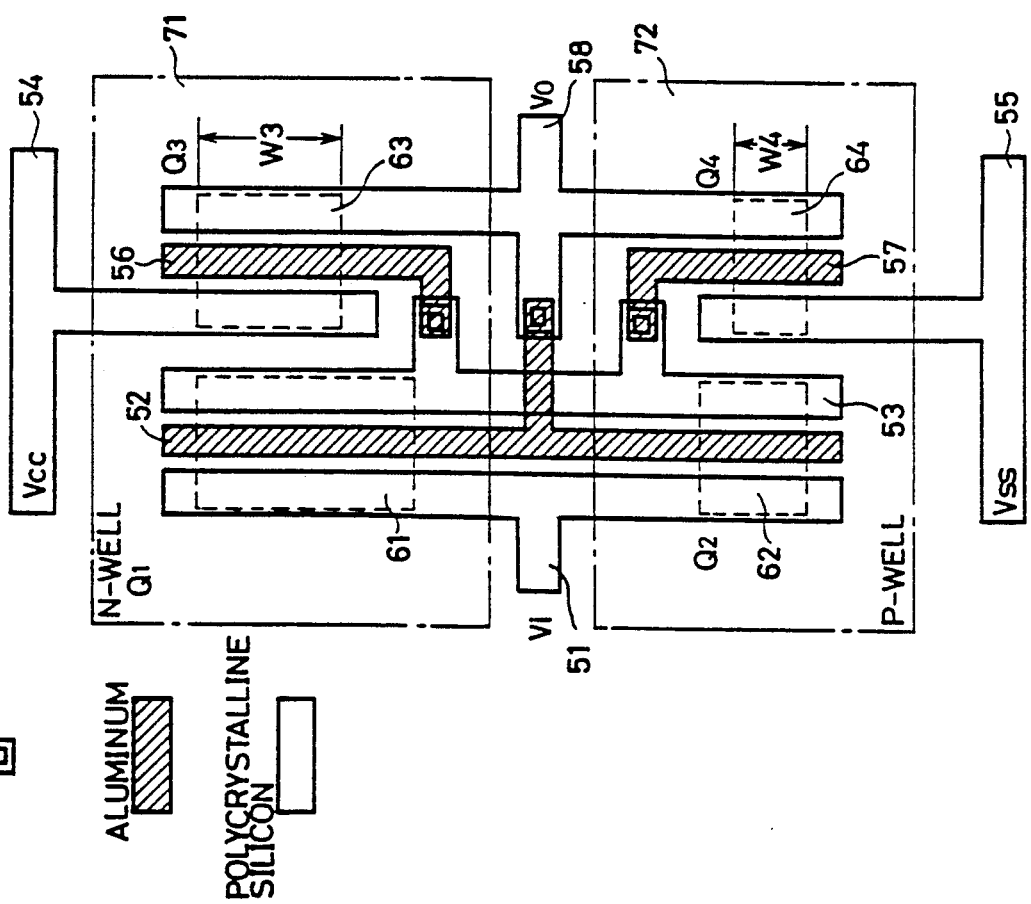

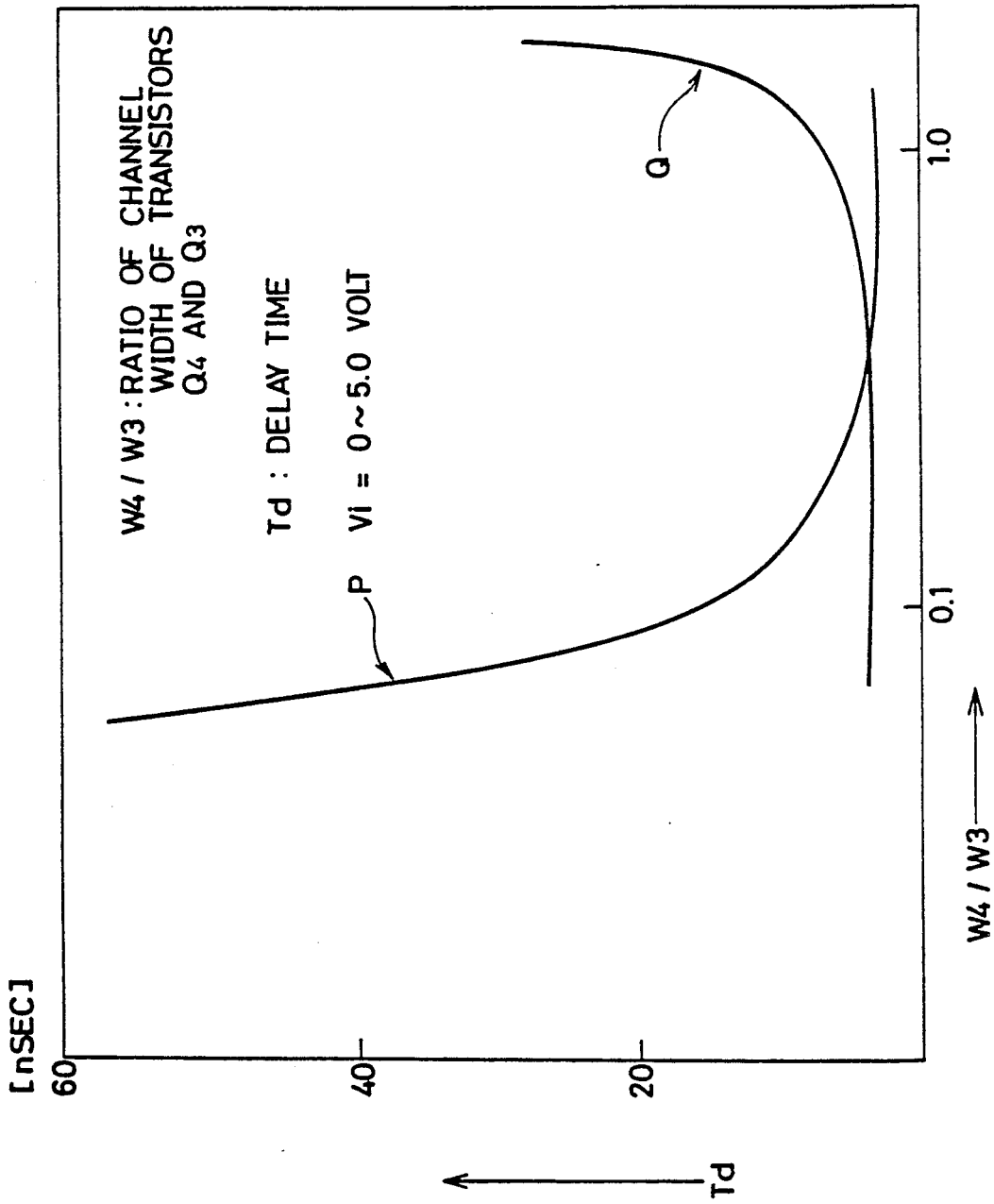

DELAY CIRCUIT EMPLOYING DIFFERENT THRESHOLD FET'S

This application is a continuation of application Ser. No. 07/155,541 filed Feb. 12, 1988.

BACKGROUND OF THE INVENTION

1. Field of the Invention

The present invention relates to a delay circuit and, more specifically, it relates to an inverter circuit which outputs an output signal delayed from an input signal.

2. Description of the Prior Art

In the conventional delay circuit, for example an inverter circuit having a complementary insulated gate device, a capacitor for waveform shaping is connected between an input and the power supply or between an input and the ground of the inverter circuit to obtain an output signal delayed from an input signal.

FIG. 1 is a schematic diagram showing one example of a conventional delay circuit having a complementary insulated gate device. The delay circuit having the insulated gate device shown in FIG. 1 comprises a MOS (Metal Oxide Semiconductor) capacitor C1 for waveform shaping and an inverter 30. The capacitor C1 is connected between an input terminal 1 and the power supply $V_{cc}$. The inverter 30 comprises a series connection of a p type MIS Metal Insulator Semiconductor) filed effect transistor Q5 and an n type MIS field effect transistor Q6 connected between the power supply $V_{cc}$ and the ground $V_{ss}$. Each of the gates of the transistor Q5 and the transistor Q6 is connected together to the input terminal 1. The node of the transistor Q5 and the transistor Q6 constitutes an output terminal 3 of the circuit. An input signal Vi is applied to the input terminal 1 and an output signal Vo is outputted from the output terminal 3.

FIGS. 2(a) and 2(b) are timing charts in which FIG. 2(a) shows the change in the input signal Vi and FIG. 2(b) shows the change in the output signal Vo in the delay circuit shown in FIG. 1.

The operation of the delay circuit shown in FIG. 1 will be described with reference to FIGS. 2(a) and 2(b). When the input signal Vi applied to the input terminal 1 rises as shown in FIG. 2(a), the channel of the MOS capacitor C1 has been already formed, and the charge is stored in the capacitor C1, so that the output signal Vo falls with a delay from the change of the input signal Vi, as shown in FIG. 2(b). On the other hand, when the input signal Vi falls, the channel of the MOS capacitor C1 is not formed, so that the output signal Vo rises with a slight delay. Therefore, in the delay circuit shown in FIG. 1, an output signal Vo is provided at the output terminal 3 in which the waveform of the fall, i.e., the leading edge (shown in FIG. 2(b) by an arrow P) is much delayed.

FIG. 3 is a schematic diagram showing another example of a conventional delay circuit having a complementary insulated gate device. Compared with the delay circuit shown in FIG. 1, the delay circuit of FIG. 3 comprises a MOS capacitor C2 instead of the MOS capacitor C1 connected between the input terminal 1 and the ground $V_{ss}$. The other portions of the delay circuit shown in FIG. 3 are the same as these of FIG. 1, so that the detailed description thereof will be omitted.

FIGS. 4(a) and 4(b) are timing charts in which FIG. 4(a) shows the change of the input signal Vi and FIG. 4(b) shows the change of the output signal Vo of the delay circuit shown in FIG. 3.

The operation of the delay circuit shown in FIG. 3 will be described with reference to FIGS. 4(a) and 4(b). When the input signal Vi applied to the input terminal 1 rises as shown in FIG. 4(a), the channel of the MOS capacitor C2 is not formed, so that the output signal Vo falls being slightly delayed from the change of the input signal Vi, as shown in FIG. 4(b). On the other hand, when the input signal Vi falls, the channel of the MOS capacitor C2 has been already formed, and the charge is stored in the capacitor C2, so that the output signal Vo rises with a delay from the change of the input signal Vi. Therefore, in the inverter circuit shown in FIG. 3, an output signal Vo is provided at the output terminal in which the rising waveform, i.e., the trailing edge (shown in FIG. 4(b) by an arrow Q), is much delayed.

Since the above described two conventional delay circuits having complementary insulated gate devices comprise capacitor means, the rise time or fall time is long in both circuits when the output signal changes.

A prior art of particular interest to the delay circuit of the present invention is in Japanese Patent Laying-Open Gazette No. 293016/1986 entitled "Delay Circuit". The prior art is the same as the inverter circuit of the present invention in an aspect that it comprises a transmission gate connected to a preceding stage of the inverter, but it clearly differs from the delay circuit of the present invention in the following points, that is, the gates of two FETs included in the transmission gate are both connected to an input terminal and that it has a function of a limiter circuit.

SUMMARY OF THE INVENTION

Therefore, a main object of the present invention is to provide a delay circuit having a complementary insulated gate device in which the time required for the rise and fall of the output signal is decreased.

Briefly stated, the present invention comprises inverter means and transmission gate means connected to the preceding stage of the inverter means comprising a parallel connection of a first and second complementary field effect devices, connected between the input and output of the circuit. The input of the transmission gate means is connected to the input of the circuit and the gates of the first and second field effect devices are connected together to the output of the inverter means. The output of the inverter means constitutes the output of the circuit.

According to the present invention, in the transition time of the increase and decrease of the voltage applied to the input, there is a peculiar period in which the transmission gate means transmit only a little input voltage in response to the output voltage of the inverter means. In this peculiar period, the inverter means receives the slightly changing input voltage and when the input voltage reaches the threshold voltage of the inverter means, the inverter means is inverted. The speed of the change in the voltage from the transmission gate means applied to the input of the inverter means determines the time period until inversion takes place in the inverter means, that is, the delay time. Since the delay circuit employs transmission gate means and not the capacitor means, the rise time and fall time of the output voltage outputted from the output circuit, that is the output from the inverter means, are short.

The present invention provides a delay circuit whose output signal has short rise time and fall time.

In a preferred embodiment, the present invention further comprises a delay determining means for determining the delay characteristics. By virtue of the delay determining means, a delay circuit is provided in which the output signal can be selectively delayed for either the change of the increase of the voltage or the change of decrease of the voltage applied to the input.

These objects and other objects, features, aspects and advantages of the present invention will become more apparent from the following detailed description of the present invention when taken in conjunction with the accompanying drawings.

BRIEF DESCRIPTION OF THE DRAWINGS

FIGS. 4(a) and 4(b) are timing charts for describing the operation of the delay circuit shown in FIG. 3;

FIG. 5 is a schematic diagram showing one example of a delay circuit having a complementary insulated gate device in accordance with the present invention;

FIGS. 6(a), 6(b) and 6(c) are timing charts for describing one example of the operation of the delay circuit shown in FIG. 5;

FIGS. 7(a), 7(b) and 7(c) are timing charts for describing another example of the operation of the delay circuit shown in FIG. 5;

FIGS. 8A and 8B are plan views respectively showing examples of the structure of the delay circuit shown in FIG. 5;

FIG. 9 is a graph showing the change of the delay time when the ratio of the channel width of the two transistors constituting the inverter of the delay circuit of FIG. 5 is changed.

DESCRIPTION OF THE PREFERRED EMBODIMENTS

Figure 1:
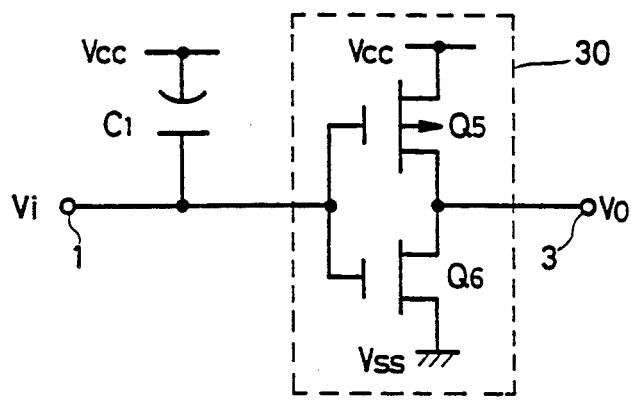
FIG. 1 is a schematic diagram showing one example of a conventional delay circuit having a complementary insulated gate device.
Figure 3:
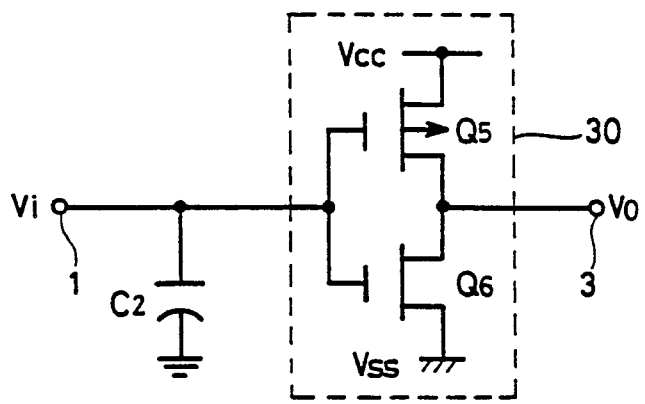
FIG. 3 is a schematic diagram showing another example of a conventional delay circuit having a complementary insulated gate device.

FIG. 5 is a schematic diagram showing one example of a delay circuit having a complementary insulated gate device in accordance with the present invention. Compared with the delay circuits shown in FIGS. 1 and 3, in the delay circuit shown in FIG. 5, a transmission gate 20 is provided instead of the MOS capacitor. The transmission gate 20 comprises a parallel connection of a p type MIS field effect transistor Q1 and an n type MIS field effect transistor Q2. The gates of the respective transistors Q1 and Q2 are connected together to the output terminal 3 to receive the output signal of the inverter 10. The drains of the respective transistors Q1 and Q2 are connected together to form one terminal of the transmission gate 20 and the sources of the transistors are connected together to form the other terminal. One of the one and the other terminals constitutes an input terminal 1 of the circuit, and an input signal having a predetermined two voltage levels is applied thereto. The other one constitutes an output of the transmission gate 20 and is connected to the input of the inverter 10 at a node M. The inverter 10 comprises a p type MIS field effect transistor Q3 and an n type MIS field effect transistor Q4. The circuit connection of the inverter 10 is the same as in the delay circuit 30 of FIGS. 1 and 3, so that the description of the connection will be omitted.

The delay circuit of FIG. 5 having the above described circuit connection has a function of outputting an output signal Vo delayed from the change of the input signal Vi, and a particular delay characteristic, which will be described in the following, is brought about by the following settings of the delay circuit shown in FIG. 5. Namely, the logical threshold voltage of the inverter 10 is set at a voltage value near the high level or a voltage value near the low level in the range of the voltage applied to the input of the inverter 10.

First, description will be made of a case in which the logical threshold voltage of the inverter 10 is set at a voltage value near the high level.

FIGS. 6(a), 6(b) and 6(c) are timing charts for describing the operation of the delay circuit shown in FIG. 5 when the logical threshold voltage in the inverter 10 is set at a value near the high level in the range of the input voltage. In FIGS. 6(a), 6(b) and 6(c) show the changes of the input voltage Vi applied to the input terminal 1, the voltage Vm of the node M and the output voltage Vo of the output terminal 3, respectively.

Figure 2A:
FIGS. 2(a) and 2(b) are timing charts for describing the operation of the delay circuit shown in FIG. 1.
Figure 2B:
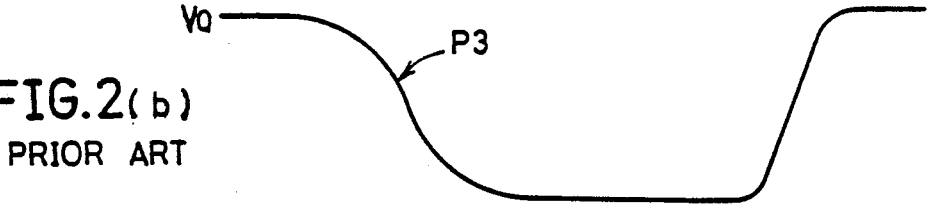

The operation of the circuit shown in FIG. 5 will be hereinafter described with reference to FIG. 6. First, description will be made of a case in which the input voltage changes from the low level to the high level. As shown in FIG. 6(a), when the input voltage Vi is at the low level or the value near the low level, the transistor Q2 turns on in response to the voltage Vo from the high level output applied to the gate thereof. Therefore, as show in FIG. 6(b), the voltage Vm of the node M increases corresponding to the increase of the input voltage Vi. At time t1, since the voltage difference between the voltage Vm of the node M and the output voltage Vo becomes smaller than the threshold value of the transistor Q2, so that the transistor Q2 turns off. In the period between the time t1 and t2, the transistors Q1 and Q2 are both off, so that the node M is brought to the electrically floating state. In this off state of the transistors Q1 and Q2, slight increase of the input voltage Vi can be transmitted to the node M, the voltage Vm of the node M slightly increases, although it is in the electrically floating state. Consequently, as shown in FIG. 6(c), in the period between t1 and t2, the output voltage Vo slightly decreases in response to the slight increase of the voltage Vm of the node M. At time t2, the voltage difference between the output voltage Vo and the input voltage Vi becomes larger than the threshold value of the transistor Q1, the transistor Q1 turns on and the voltage Vm of the node M again increases. As described above, since the logical threshold value of the inverter 10 is set at the value near the high level of the input voltage Vi, the inverter 10 is inverted immediately after the time t2 in response to the re-increase of the voltage Vm of the node M and outputs a low level output voltage Vo, as shown in FIG. 6(c). In the manner as described above, when the input voltage Vi changes from the low level to the high level, the output voltage Vo changes from the high level to the low level with a delay, with the change quicker than the change of the output voltage Vo shown in FIG. 2(a) of the conventional inverter circuit shown in FIG. 1.

Next, description will be made of a case in which the input voltage Vi changes from the high level to the low level. When the input voltage Vi is at the high level or a level near the high level, the transistor Q1 of the transmission gate 20 is on. When the input voltage Vi decreases from the high level and the voltage Vm of the node M decreases to be smaller than the logical threshold value of the inverter 10, the inverter 10 is inverted and the output voltage Vo increases as shown in FIG. 6(c). Since the transistor Q2 of the transmission gate 20 turns on by the increase of the output voltage Vo, the input voltage Vi is applied to the node M without delay. Therefore, when the input voltage Vi changes from the high level to the low level, the output voltage Vo changes from the low level to the high level without delay with the change being quicker than the change of the output voltage Vo shown in FIG. 2(a) of a conventional inverter circuit shown in FIG. 1. As described above, when the logical threshold voltage of the inverter 10 is set at a value near the high level of the input voltage, only the leading edge (shown in FIG. 6(c) by an arrow P) of the output voltage Vo is delayed.

FIGS. 7(a), 7(b) and 7(c) are timing charts in relation with the delay circuit shown in FIG. 5, showing the case in which the logical threshold voltage of the inverter 10 is set at a value near the low level in the range of the voltage applied to the input of the inverter 10. In FIGS. 7(a), 7(b) and 7(c) show the changes of the input voltage Vi, voltage Vm of the node M and the output voltage Vo, respectively.

The operation of the circuit shown in FIG. 5 will be briefly described in the following with reference to FIGS. 7(a), 7(b) and 7(c). When the input voltage Vi changes from the low level to the high level, the transistors Q1 and Q2 of the transmission gate 20 successively turn on, so that the output voltage Vo changes from the high level to the low level without delay. Next, when the input voltage Vi changes from the high level to the low level, the transistor Q1 changes from the on state to the off state and, consequently, there is a period in which both transistors Q1 and Q2 are off. Thereafter, the transistor Q2 turns on, therefore, compared with the change of the input voltage Vi, the change of the output voltage Vo is delayed. Therefore, when the input voltage Vi changes from the high level to the low level, the output voltage Vo changes from the low level to the high level with a delay. These changes of the output voltage Vo are quicker than the change of the output voltage Vo shown in FIG. 4 of the conventional inverter circuit shown in FIG. 3. As described above, when the logical threshold voltage of the inverter 10 is set at the value near the low level of the input voltage, only the trailing edge (shown in FIG. 7(c) by an arrow Q) of the output voltage Vo is delayed.

As described above, the delay circuit such as shown in FIG. 5 brings about a quick change of the output voltage Vo, namely, the change of the output voltage Vo with shortened rise time and fall time. In addition, by changing the setting of the logical threshold voltage of the inverter 10 in the circuit of FIG. 5, the delay characteristics of the delay circuit shown in FIG. 5 can be determined.

Some methods for determining the delay characteristics of the delay circuit shown in FIG. 5 will be described in the following.

FIGS. 8A and 8B are plan views showing examples of the structure of the delay circuit shown in FIG. 5, respectively. FIG. 8A shows the case in which the logical threshold voltage of the inverter 10 is set at a value near the high level input voltage while FIG. 8B shows the case in which the logical threshold voltage in the inverter 10 is set at a value near the low level input voltage.

Referring to FIG. 8A, transistors Q1 and Q3 are formed in an n-well 71 in the substrate and the transistors Q2 and Q4 are formed in a p-well 72. An input voltage Vi is applied to an aluminum wiring 51 and the aluminum wiring 51 is connected to the sources of the transistors Q1 and Q2. The drains of the transistors Q1 and Q2 are connected to the gate 56 of the transistors Q3 and the gate 57 of the transistor Q4, respectively, by the aluminum wiring 53. The source of the transistor Q3 is connected to the power supply $V_{cc}$ by the aluminum wiring 54 and the source of the transistor Q4 is connected to the ground $V_{ss}$ by the aluminum wiring 55. The drain of the transistor Q3 and the drain of the transistor Q4 are both connected to the output Vo by the aluminum wiring 58. The gate of the transistor Q1 and the gate of the transistor Q2 are also connected to the output Vo by the aluminum wiring 58 through a polycrystalline silicon 52. P type impurities are diffused into the channel 61 of the transistor Q1 and into the channel 63 of the transistor Q3 while n type impurities are diffused into the channel 53 of the transistor Q2 and the channel 64 of the transistor Q4. In FIG. 8A, the channel width W3 of the transistor Q3 is set wider than the channel width W4 of the transistor Q4 in order to set the logical threshold voltage of the inverter at a higher value.

On the other hand, in FIG. 8B, compared with the FIG. 8A, the channel width W3 of the transistor Q3 is set to be smaller than the channel width W4 of the transistor Q4 in order to set the logical threshold voltage of the inverter at a lower value.

FIG. 9 is a graph showing the relation between the ratio of the respective channel width W3 and W4 of the transistor Q3 and transistor Q4 of the inverter and the delay time between the input signal and output signal provided by the delay circuit of FIG. 5.

Referring to FIG. 9, the abscissa denotes the ratio of W4/W3 on a logarithmic scale, while the ordinate denotes the delay time Td. The delay time Td of the curve indicated by an arrow P shows the delay time of the leading edge of the output signal in relation to the change of the input signal shown by the arrow P in the time chart of FIG. 6(c), while the delay time Td of the curve indicated by an arrow Q shows the delay time of the trailing edge shown by the arrow Q in the time chart of FIG. 7. As can be seen from the graph of FIG. 9, appropriately selecting and setting the ratio W4/W3 is effective in determining the delay characteristic and the delay time of the circuit shown in FIG. 5.

Another approach to determine the delay characteristic of the delay circuit shown in FIG. 5 is to select the respective threshold voltages of the transistor Q1 and the transistor Q2 of the transmission gate. In order to obtain the delay characteristic of the leading edge of the output voltage Vo shown in the time chart of FIG. 6(c), it is effective to set the threshold voltage of the transistor Q1 larger than that of the transistor Q3 of the inverter 10 and/or to set the threshold voltage of the transistor Q2 larger than that of the transistor Q4 of the inverter 10. In order to obtain the delay characteristic of the trailing edge of the output voltage Vo shown in the time chart of FIG. 7(c), it is effective to set the threshold voltage of the transistor Q1 smaller than that of the transistor Q3 of the inverter 10 and/or to set the threshold voltage of the transistor Q2 smaller than that of the transistor Q4 of the inverter 10. Meanwhile, in order to selectively set the threshold voltages of these transistors, it is effective to change the impurity concentrations of the respective channels of the transistors.

A further approach to determine the delay characteristic of the delay circuit of FIG. 5 is to shift the high level and low level voltage values of the input signal.

Figure 10A:
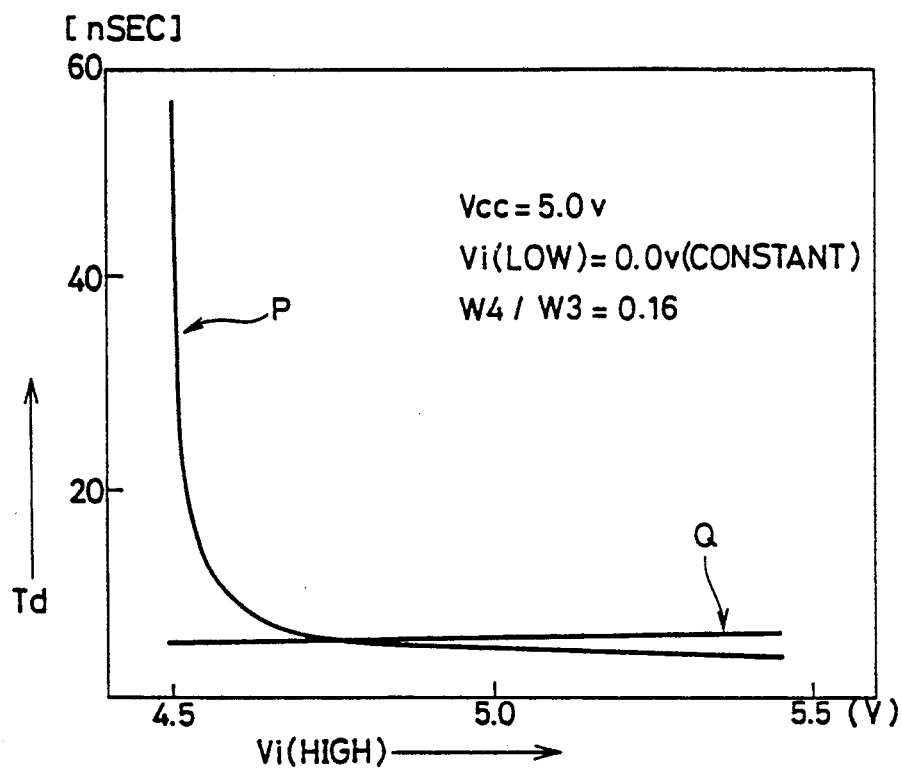
FIGS. 10A and 10B are graphs respectively showing the change of the delay time when one level of the input voltage applied to the delay circuit of FIG. 5 is changed.

FIG. 10A is a graph showing the relation between the input voltage Vi and the delay time when the high level voltage value of the input signal is changed. In FIG. 10A, the abscissa shows the high level voltage value of the input voltage Vi and the ordinate shows the delay time of the change of the output signal Vo in relation to the change of the input voltage Vi. The supply voltage is assumed to be 5 volt and the low level voltage value of the input signal Vi is constantly set at 0 volt. The ratio W4/W3 of the channel widths of the transistor Q4 and the transistor Q3 is set at 0.16. The curve indicated by the arrow P in FIG. 10A shows the change of the delay time Td of the leading edge (arrow P of FIG. 6(c) of the output signal in relation to the input signal, while the curve indicated by the arrow Q shows the change of the delay time Td of the trailing edge (arrow Q of FIG. 7(c). It can be seen from the graph of FIG. 10A that when the low level voltage value of the input signal is constant, the delay time Td of the leading edge of the output signal increases if the high level voltage value of the input signal is set low, while the delay time Td of the trailing edge of the output signal increases if it is set high. As shown by the arrow P in FIG. 10A, when the high level voltage value of the input signal is near 4.5 volt, the delay time Td of the leading edge of the output signal changes largely. The high level voltage value of the input signal, which brings the big change, increases when the ratio W4/W3 of the channel widths of the transistors Q4 and the transistor Q3 decreases and it decreases when the ratio W4/W3 increases.

Figure 10B:
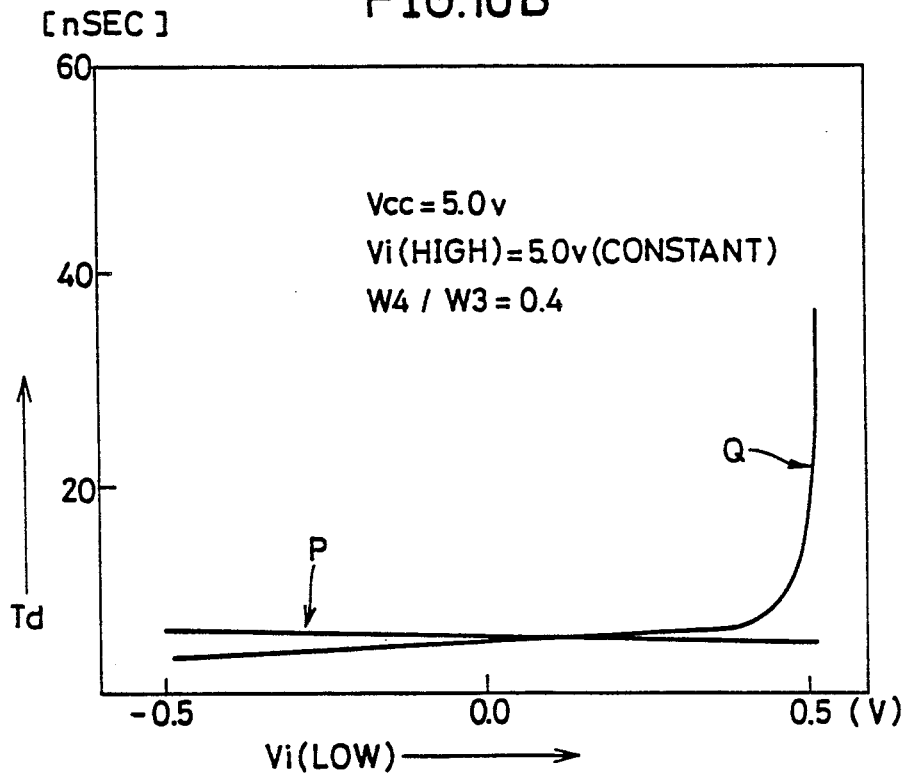

FIG. 10B is a graph showing the relation between the input voltage Vi and the delay time when the low level voltage value of the input signal is changed. In FIG. 10B, the abscissa shows the low level voltage value of the input signal Vi and the ordinate shows the delay time Td of the change of the output signal Vo in relation to the change of the input signal Vi. The supply voltage $V_{cc}$ is assumed to be 5 volt and the high level voltage value of the input signal Vi is constantly set at 5 volt. The ratio W4/W3 is set at 0.4. The curve indicated by the arrow P in FIG. 10B shows the change of the delay time Td of the leading edge (arrow P in FIG. 6(c) of the output signal in relation to the input signal, while the curve indicated by the arrow Q shows the change of the delay time Td of the trailing edge (arrow Q of FIG. 7(c). It can be seen from the graph of FIG. 10B that when the high level voltage value of the input signal is constant, the delay time Td of the leading edge of the output signal increases if the low level voltage value of the input signal is set low, while the delay time Td of the trailing edge of the output signal increases if it is set high. As shown by the arrow Q in FIG. 10B, the delay time Td of the trailing edge of the output signal changes largely when the voltage value of the input signal set at a low level is near 0.5 volt. The low level voltage value of the input signal, which brings about the big change, increases when the ratio W4/W3 decrease and it decreases when the ratio W4/W3 increases.

As described above, the delay circuit in accordance with the present invention comprises inverter means and transmission gate means formed by first and second complementary field effect devices connected to the preceding stage of the inverter means, with the gates of the first and second field effect devices connected together to the output of the inverter means. The transmission gate means receives an input voltage which is applied to the input thereof when the input voltage changes and has a peculiar period in which only a little input voltage is transmitted to the input of the inverter means in response to the voltage from the output of the inverter means. Due to the presence of this peculiar period, the change of the output of the inverter means, that is the output voltage of this circuit, is delayed. Since this delay circuit needs no capacitor means such as a capacitor for the delay, a delay circuit can be obtained in which the rise time and fall time of the output signal are short.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A delay circuit comprising:
    an input for receiving an input signal;
    an output for outputting an output signal;
    transmission gate means having a first field effect device of a certain conductivity type and a second field effect device of the opposite conductivity type each having the source, drain and insulated gate with said source and drain being arranged in operational relation wherein
    respective sources of said first and second field effect devices are directly connected together at a node to form a first terminal of said transmission gate means,
    respective drains of said first and second field effect devices are directly connected together at a node to form a second terminal of said transmission gate means,
    one of said first and second terminals of said transmission gate means constitutes said input; and
    inverter means connected between a power supply and the ground, wherein
    the input of said inverter means is connected to said output of said transmission gate means,
    the output of said inverter means constitute said output, and
    the gates of said first and second field effect devices of said transmission gate means are directly connected together to said output.

2. A delay circuit of claim 1, wherein said inverter means comprises a field effect device.

3. A delay circuit of claim 2, wherein said field effect device comprises complementary field effect devices.

4. A delay circuit of claim 3, wherein
    said inverter means comprises a series connection of a third field effect device of a certain conductivity type and a fourth field effect device of the opposite conductivity type each having a source, a drain and an insulated gate with said source and drain being arranged in operational relation, wherein
    the gates of said third and fourth field effect devices are connected together to form said input of said inverter means, and
    the node of said third and fourth field effect devices constitutes said output of said inverter means.

5. A delay circuit of claim 1, further comprising a delay determining means for determining the delay characteristic between an input signal and an output signal.

6. The delay circuit of claim 1, wherein a delay characteristic between said input signal and said output signal is responsive to a logical threshold value of said inverter.

7. The delay circuit of claim 4, wherein the logical threshold value of said inverter is set by adjusting a ratio of respective channel widths of said third and fourth field effect devices.

8. The delay circuit of claim 1, wherein a delay characteristic between said input signal and said output signal is responsive to a voltage of said input signal.

9. The delay circuit of claim 1, wherein a delayed output signal changes from a high output logic value to a low output logic value lower than the high output logic value in response to the input signal transitioning from a low input logic value to a high input logic value higher than the low input logic value.

10. The delay circuit of claim 7, wherein the channel width of said third field effect device is larger than the channel width of said fourth field effect device.

11. The delay circuit of claim 4, wherein
the threshold value of said first field effect device is higher than the threshold value of said third effect device and
the threshold value of said second field effect device is higher than the threshold value of said fourth field effect device.

12. A delay circuit of claim 1, wherein said delay characteristic comprises a characteristic in which the delayed output signal changes from a low output logic level value to a high output logic level value only when the input signal changes from a high input logic value to a low input logic level value.

13. The delay circuit of claim 4, wherein a channel width of said fourth field effect device is larger than a channel width of said third field effect device.

14. The delay circuit of claim 4, wherein
a threshold value of said first field effect device is lower than a threshold value of said third field effect device, and
a threshold value of said second field effect device is lower than a threshold value of said fourth field effect device.

15. A delay circuit of claim 4, wherein said certain conductivity type is p type and said opposite conductivity type is n type.

16. A delay circuit comprising:
an input for receiving an input signal;
an output for outputting an output signal;
transmission gate means having a first field effect device of a certain conductivity type and a second field effect device of the opposite conductivity type each having the source, drain and insulated gate with said source and drain being arranged in operational relation, wherein
respective sources of said first and second field effect devices are directly connected together at a node to form one terminal of said transmission gate means,
respective drains of said first and second field effect devices are directly connected together at a node to form another terminal of said transmission gate means,
one of said one and the other terminals of said transmission gate means constitutes said input; and
inverter means connected between a power supply and the ground, wherein
the input of said inverter means is connected to said output of said transmission gate means,
the output of said inverter means constitute said output,
the gates of said first and second field effect devices of said transmission gate means are directly connected together to said output, and
wherein a delay characteristic between said input signal and said output signal is responsive to (i) a logical threshold value of said inverter, (ii) one of the threshold values of said first and second field effect devices, and (iii) a high or low voltage level of said input signal.

17. The delay circuit of claim 16, wherein said output signal changes from a high output logic value to a low output logic value lower than the high output logic value in response to the input signal transitioning from a low input logic value to a high input logic value higher than the low input logic value.

18. A delay circuit of claim 16, wherein said delay characteristic comprises a characteristic in which the delayed output signal changes from a fourth value to a third value only when the input signal changes from a second value to a first value.

19. A delay circuit comprising:
an input terminal for receiving an input signal;
an output for providing an output signal;
transmission gate means having first and second field effect devices of opposite conductivity types, respective sources of said first and second field effect device connected together to form one terminal of said transmission gate means, respective drains of said first and second field effect devices connected together to form another terminal of said transmission gate means, one of said terminals of said transmission gate means constituting said input terminal of said delay circuit, and the other of said terminals of said transmission gate means constituting an output terminal of said transmission gate means; and
inverter means including
(a) an input terminal,
(b) an output terminal,
(c) a series connection of third and fourth field effect devices of opposite conductivity types, said inverter means output terminal connected to a junction of said third and fourth field effect devices forming said series connection, respective insulated gates of said third and fourth field effect devices connected to said input terminal of said inverter means, said input terminal of said inverter means connected to said output of said transmission gate means and said output terminal of said inverter means constituting said delay circuit output, and
the gates of said first and second field effect devices of said transmission gate means connected to said delay circuit output,
wherein a delay characteristic between said input signal and said output signal is responsive to (i) a logical threshold value of said inverter, (ii) one of the threshold values of said first and second field effect devices, and (iii) a high or low voltages level of said input signal.

20. A delay circuit comprising:
an input for receiving an input signal;
an output for outputting an output signal;
transmission gate means consisting of a first field effect device of a certain conductivity type and a second field effect device of the opposite conductivity type each having the source, drain and insulated gate with said source and drain being arranged in operational relation, respective sources of said first and second field effect devices are connected together to form a first terminal of said transmission gate means, and respective drains of said first and second field effect devices connected together to form a second terminal of said transmission gate means, one of said first and second terminals of said transmission gate means constitutes said input; and inverter means connected between a power supply and the ground, wherein the input of said inverter means is connected to said output of said transmission gate means, the output of said inverter means constitute said output, and the gates of first and second field effect devices of said transmission gate means are directly connected together to said output.

* * * * *